United States Patent
Wang et al.

(10) Patent No.: US 6,549,045 B1
(45) Date of Patent: Apr. 15, 2003

(54) CIRCUIT FOR PROVIDING CLOCK SIGNALS WITH LOW SKEW

(75) Inventors: Bonnie Wang, Cupertino, CA (US); Chiakang Sung, Milpitas, CA (US); Khai Nguyen, San Jose, CA (US); Joseph Huang, San Jose, CA (US); Xiaobao Wang, Santa Clara, CA (US); In Whan Kim, San Jose, CA (US); Gopi Rangan, Santa Clara, CA (US); Yan Chong, Stanford, CA (US); Phillip Pan, Freemont, CA (US); Tzung-Chin Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/043,620

(22) Filed: Jan. 11, 2002

(51) Int. Cl.[7] .................. H03K 2/100; H03K 23/00; H03K 25/00
(52) U.S. Cl. .................. 327/115; 327/117; 377/47; 377/48
(58) Field of Search .................. 327/113, 114, 327/115, 117; 377/47, 48, 106, 70, 77, 78; 341/101

(56) References Cited

U.S. PATENT DOCUMENTS 5,056,120 A * 10/1991 Taniguchi et al. .......... 375/371
6,041,093 A * 3/2000 Cho .......................... 377/47
6,459,393 B1 * 10/2002 Nordman .................. 341/100

OTHER PUBLICATIONS

Shankar, "Design Ideas : Shift register divides clock," EDN Access, Jan. 5, 1995.

* cited by examiner

Primary Examiner—Tuan T. Lam
(74) Attorney, Agent, or Firm—Pennie & Edmonds LLP (57) ABSTRACT

A digital, preferably programmable, circuit is disclosed for providing one or more clock signals with variable frequency and/or phase. The clock signals exhibit a low amount of skew relative to other clock signals and data signals provided by the circuit. In one embodiment, the circuit includes a plurality of channels each having a parallel-in/serial-out shift register, a flip-flop, and a delay circuit. The shift register can receive data bits in data channels or clock frequency select bits in frequency-divided clock channels. The serial output from the register acts as an input for the flip flop, both of which are triggered by an input reference clock. The delay circuit delays the input reference clock. In each channel, a multiplexer is configured to select the clock or data channel output from the register, flip-flop, and delay circuit outputs. Since the delays in all output paths are matched, skew is minimized.

31 Claims, 5 Drawing Sheets

Fig. 6

CIRCUIT FOR PROVIDING CLOCK SIGNALS WITH LOW SKEW

FIELD OF THE INVENTION

The present invention relates generally to the field of digital electronics and circuitry. More particularly, it relates to a circuit for providing clock signals with variable frequency and phase and for transmitting those signals so that they exhibit a low amount of skew relative to data signals and other clock signals.

BACKGROUND OF THE INVENTION

Digital electronic systems generally include a number of component devices such as processors, bus drivers, memory devices, controllers and programmable logic devices (PLDs). These devices are generally implemented in integrated circuit chips or modules. Clock signals are used throughout an electronic system, such as a computer system, to synchronize communication between the devices as well as within the devices themselves. At the system level, a master clock generator provides a primary reference clock signal at a predetermined operating frequency, which is typically a relatively high frequency.

At both the system and device levels, clock signals of different frequencies are often needed to meet the I/O requirements of different devices (or distinct parts of a device). Clock dividers are therefore commonly used to frequency divide the reference clock signal into one or more clock signals operating at a lower frequency. The frequency division factor is typically an integer such as 2, 3, 4, etc. The frequency-divided clock signals are provided to different devices throughout the system, and, within each device, a phase locked loop (PLL) circuit is typically used to generate an internal clock signal that is synchronized to the external clock signal. In addition, different phases of a clock signal may be used for sequencing logic in devices, especially memory devices such as synchronous dynamic random access memory (SDRAM). In particular, there are generally three types of clocking protocols: clocking on the rising edge of the clock signal, clocking on the falling edge of the clock signal, and clocking on both edges of the clock signal. Depending on the protocol and/or other clocking requirements, the phase of a clock signal may need to be set so that the rising and/or falling edges of the clock signal are appropriately aligned with respect to data transitions.

Within a system or device, the various clock signals are typically generated by clock generating frequency synthesizers and then transmitted, along with data, by drivers or other suitable transmission circuitry. An important requirement in designing a multiple clock system is to avoid or minimize clock skew. Clock skew is the phase difference between two clock signals transmitted to different devices within a system. These phase offsets occur primarily as a result of non-uniform propagation delays in the overall circuitry. When clock skew causes a significant difference in time between the arrival of a clock signal at devices that are interfacing with one another, this may lead to errors and undesirable conditions such as bus contention. As clock frequencies increase, the skew tolerance, i.e., the allowable error margin to account for skew, decreases. Furthermore, skew in the desired alignment between transmitted data and a clock signal must also be minimized, since discrepancies in that alignment can lead to errors and/or a loss of data. Consequently, there is a need for an improved programmable circuit capable of generating clock signals of varying frequency and phase and of transmitting those clock signals, together with data signals, with a very low amount of skew.

SUMMARY OF THE INVENTION

The present invention relates to a digital, in one embodiment programmable, circuit for providing one or more clock signals with variable frequency and/or phase, and in which the clock signals exhibit a low amount of skew relative to data signals and other clock signals provided by the circuit. The clock signals may be frequency divided with respect to an input reference clock, and the phase of such clock signals may also be varied to provide a desired alignment with data signals. Since the input clock-to output delays are matched in all possible output paths for the clock and data signals, skew between the clock and data signals is minimized.

In one aspect, the present invention provides a circuit comprising a plurality of channel circuits in which each channel includes a shift register circuit, a flip-flop circuit, and a multiplexer circuit. The shift register circuit receives a plurality of input bit signals in parallel and shifts out a serial output signal in response. The shift register circuit is triggered by an input clock signal. The flip-flop circuit, which may be a delay-type flip-flop circuit, receives the register output signal at an input thereof and provides a flip-flop output signal in response. The flip-flop circuit is also triggered by the input clock signal. The multiplexer circuit receives the register output signal and the flip-flop output signal at first and second inputs. The multiplexer circuit is configured, e.g., programmed, to output the signal at one of the multiplexer inputs as a channel output signal. In one embodiment, the input clock-to-output delay of the shift register is substantially the same as the input clock-to-output delay of the flip-flop circuit.

In one embodiment, at least one channel circuit is a frequency-divided clock channel circuit in which the plurality of parallel input bit signals received by the shift register are fixed digital signals. In this case, the register output signal and the flip-flop output signal in that channel are each clock signals having a frequency that is divided down by a factor of at least two with respect to the input clock signal. The frequency may also be divided down by a factor of 3, 4, or any other integer amount. The fixed digital signals may be programmable to facilitate clock frequency selection. In one embodiment, in each frequency-divided clock channel circuit, the shift register is triggered by a first (e.g., rising) edge in the input clock signal and the flip-flop circuit is triggered by a second (e.g. falling) edge in the input clock signal, so that the register output clock signal and the flip-flop output clock signal have a phase difference equivalent in time to one half cycle of the input clock signal.

In another embodiment, at least one channel circuit is a data channel circuit in which the plurality of parallel input bit signals received by the shift register are data signals. In this case the register output signal is a serial data signal, and the multiplexer circuit in each of the data channel circuits is configured to output the serial data signal as the channel output signal.

In another embodiment, each channel circuit also includes a delay circuit for receiving the input clock signal and outputting a delayed version of the input clock signal. In this embodiment, the multiplexer circuit in each channel includes a third input for receiving the delayed version of the input clock signal. Also in this embodiment, the propagation delay of the input clock in the delay circuit is further matched with the input clock-to-output delay of the shift register and the input clock-to-output delay of the flip-flop circuit. The delay circuit may also include a programmable polarity selection input. When the polarity selection input is in a first state the delayed version of the input clock signal has substantially the same polarity as the input clock signal, while when the polarity selection input is in a second state the delayed version of the input clock signal has a substantially opposite polarity to the input clock signal. The delay circuit may comprise a delay multiplexer circuit having a first input for receiving the polarity selection input, a second input for receiving a complement of the polarity selection input, and a selection input for receiving the input clock signal.

In another aspect, the present invention provides a circuit for providing a clock signal comprising a shift register circuit, a flip-flop circuit, and a multiplexer circuit. The shift register circuit receives a plurality of fixed clock frequency select bit signals in parallel and shifts out an output clock signal in response. The shift register circuit is triggered by an input clock signal, and the register output clock signal has a frequency that is divided down by a factor of at least two with respect to the input clock signal. The flip-flop circuit receives the register output clock signal at an input thereof and provides a flip-flop output clock signal in response. The flip-flop circuit is triggered by the input clock signal, and the flip-flop output clock signal has the same frequency as the register output clock signal. The multiplexer circuit receives the register output clock signal and the flip-flop output clock signal at first and second multiplexer inputs. The multiplexer circuit is configurable to output the signal at one of the multiplexer inputs as a clock output signal. Optionally, the circuit may further include a delay circuit for receiving the input clock signal and outputting a delayed version of the input clock signal. If so, the multiplexer circuit has a third input for receiving the delayed version of the input clock signal.

The circuit may further include a circuit for providing a data signal which includes: a second shift register circuit for receiving a plurality of data bit signals in parallel and shifting out a serial data signal in response; and a second multiplexer circuit for receiving the serial data signal at an input thereof. The second shift register circuit is also triggered by the input clock signal, and the second multiplexer circuit is configured to output the serial data signal. In one embodiment, the input clock-to-output delay of the second shift register is substantially the same as the input clock-to-output delay of the first shift register and as the input clock-to-output delay of the flip-flop circuit.

BRIEF DESCRIPTION OF THE DRAWINGS

The objects and advantages of the present invention will be better understood and more readily apparent when considered in conjunction with the following detailed description and accompanying drawings which illustrate, by way of example, embodiments of the invention and in which.

DETAILED DESCRIPTION OF PREFERRED EMBODIMENTS

Figure 1:
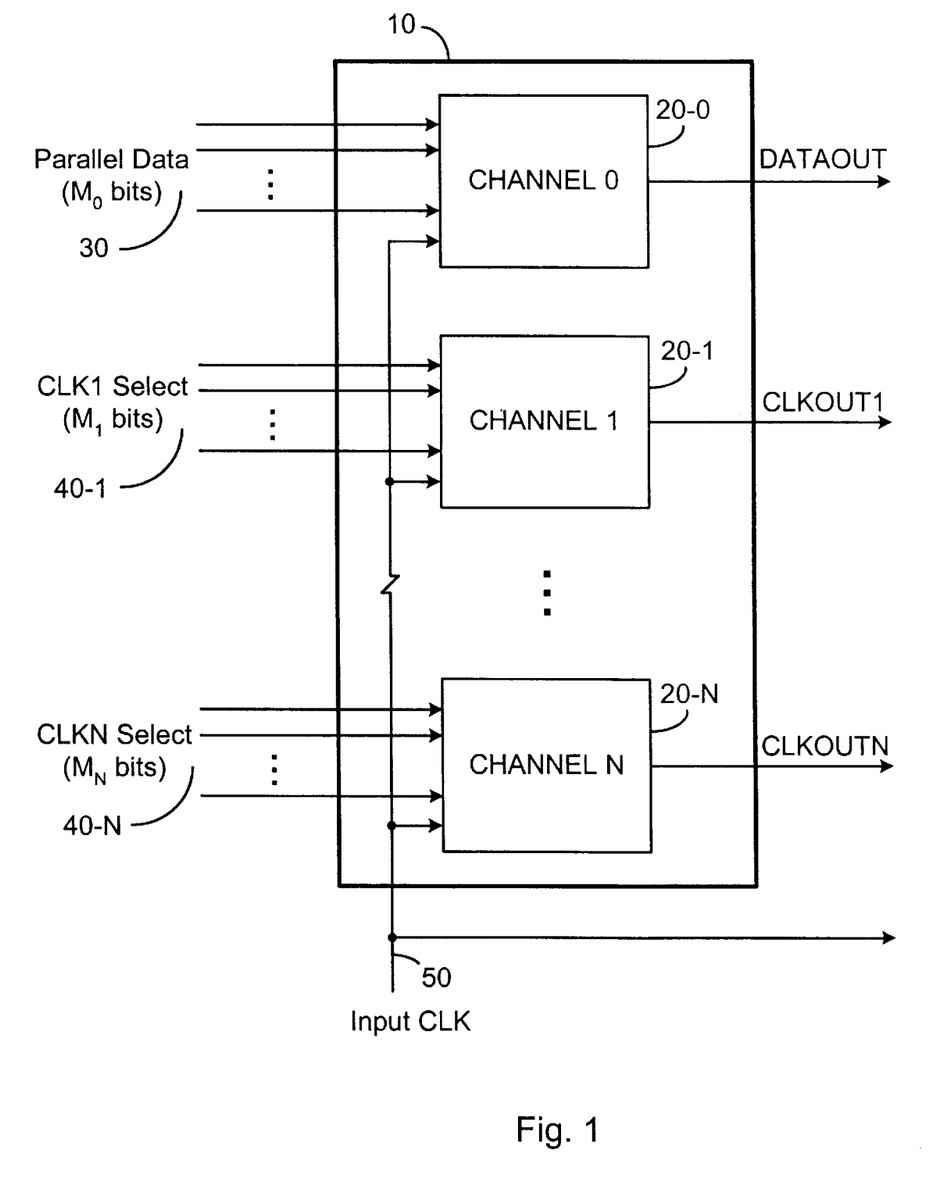
FIG. 1 is a block diagram overview of a circuit with a plurality of channels for generating and transmitting clock and data signals in accordance with one embodiment of the present invention.

FIG. 1 is a block diagram overview of a circuit 10 for generating and transmitting clock and data signals in accordance with one embodiment of the present invention. Circuit 10 includes a plurality of channel circuits 20 each providing an output serial data or clock signal. In the illustrated embodiment, a data channel 20-0 (CHANNEL 0) receives a set of parallel data signals 30 and provides a serial DATAOUT signal in response. The data signals 30 are typically received from another device or circuit in a digital electronic system. In addition, a plurality of clock channels 20-1 to 20-N (CHANNEL 1 to CHANNEL N) each receives a set of parallel CLK select bits 40-1 to 40-N and provides a clock output signal CLKOUT1 to CLKOUTN, respectively. As indicated in FIG. 1, the parallel data bits 30 provide an $M_0$-bit input to channel 20-0, the CLK1 select bits 40-1 provide an $M_1$-bit input to channel 20-1, and generally the CLKN select bits 40-N provide an $M_N$-bit input to channel 20-N. The length of the M-bit input to each channel 20 may be the same or different. It should also be noted that, depending on the size or amount of data being transmitted by circuit 10 and on the value of $M_0$ in channel 20-0, circuit 10 may include additional data channels if necessary. Each of the channel circuits 20 also receives an Input CLK signal 50 which acts as the reference or master clock in circuit 10.

In accordance with the present invention, the frequency and phase of the clock output signals CLKOUT1 to CLKOUTN are selectable, preferably programmable, parameters within circuit 10. Also, as described below, because the clock-to-output delays in all of the possible output paths in each channel circuit 20 are effectively matched, skew between the channel output signals is minimized.

Figure 2:
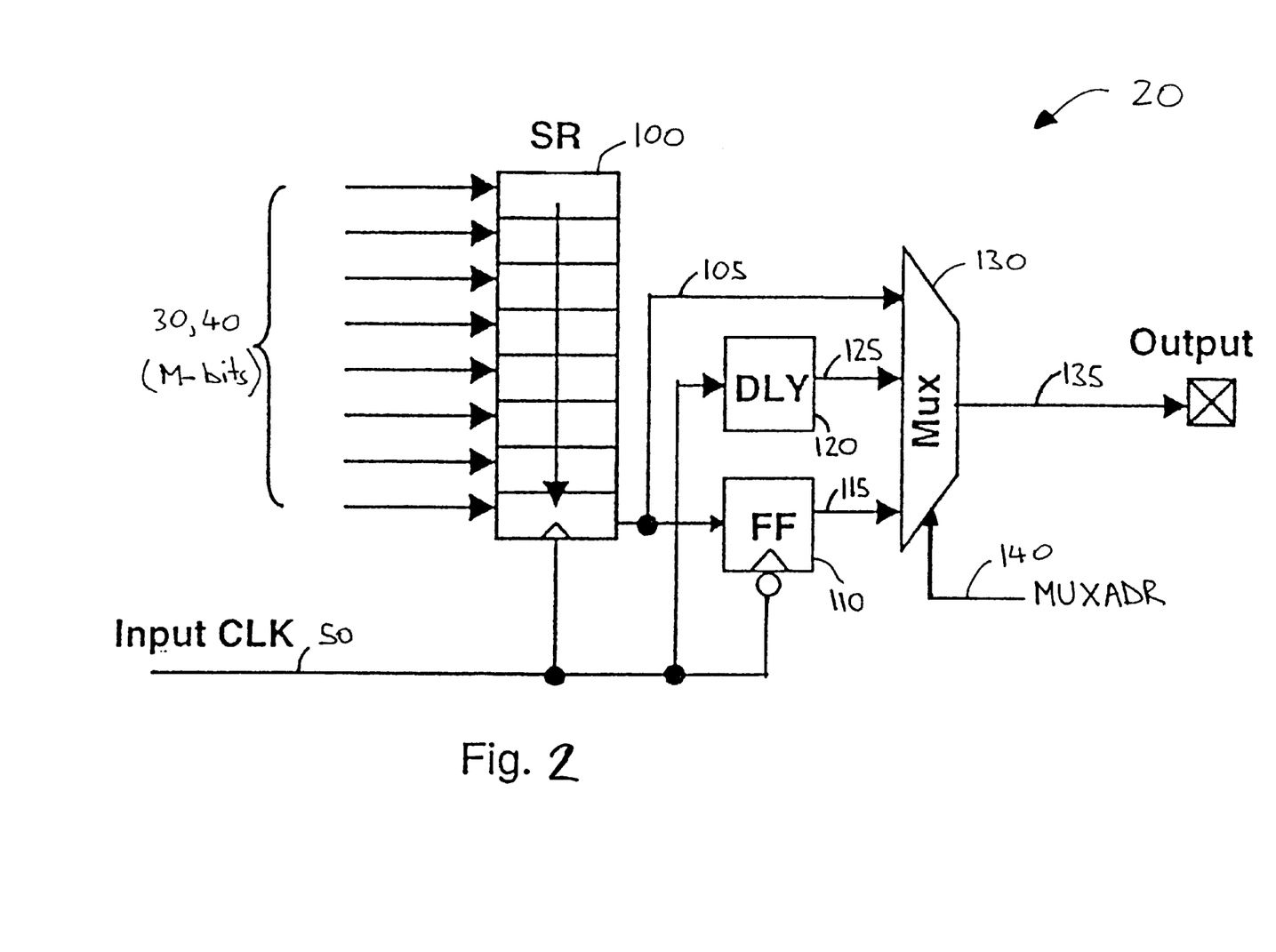
FIG. 2 is a circuit diagram of one channel circuit in the circuit of FIG. 1.

FIG. 2 is a circuit diagram of one channel circuit 20 in one embodiment. Each channel circuit includes a parallel-in/serial-out shift register circuit 100, a flip-flop circuit 110, a delay circuit 120, and a multiplexer circuit 130. Shift register 100 receives the M-bit parallel input to the channel, i.e., data bits 30 or CLK select bits 40, at its parallel-in inputs and the Input CLK signal 50 at a rising edge-configured clock trigger input. For the purposes of illustration, M=8 in FIG. 2. At each rising edge in the Input CLK signal 50, shift register 100 shifts out each input bit in a sequential manner, starting with the least significant bit, to provide a serial output signal 105. The inputs bits are shifted cyclically so that bits out of one end are shifted back into the other end. Note that the arrow in shift register 100 symbolically indicates the direction of shift and extends from the most significant bit to the least significant bit. Flip-flop 110, which may be a delay (D-type) flip-flop, receives the shift register output 105 at a signal input and the Input CLK signal 50 at a falling edge-configured clock trigger input. While shift register 100 is rising edge-triggered and flip-flop 110 is falling edge-triggered in the embodiment of FIG. 2, in an alternative embodiment shift register 100 may be triggered by the falling edge of Input CLK signal 150 and flip-flop 110 by the rising edge of signal 150. Delay circuit 120 receives the Input CLK signal 50 as its input and outputs a delayed, and optionally polarity reversed, version of the clock signal 50 as signal 125. Thus, delay circuit 120 generally operates independently of shift register 100 and flip-flop 110.

Referring still to FIG. 2, the outputs 105, 115, and 125 from shift register 100, flip-flop 110, and delay circuit 120, respectively, are provided as inputs to the multiplexer 130. In known manner, a MUXADR signal 140 selects the particular input to multiplexer 130 that is provided as the multiplexer output signal 135. The output 135 provides the serial clock or data output signal of the channel 20. Since multiplexer 130 has three input signals, MUXADR signal 140 is generally a 2-bit address signal. The MUXADR signal 140 may be a programmable 2-bit parameter that is set (according to the requirements of each particular channel circuit 20) when generating a design for a programmable logic device (PLD), for example.

The clock-to-output delay of a circuit is defined as the time from the triggering of the circuit by a clock signal until a stable output signal is present at the circuit's output. In known manner, shift registers are generally formed by a bank of several flip-flops, each triggered by the same clock signal. As a result (and as is described further below in connection with FIG. 6), the clock-to-output delay for shift register 100 and its output 105 is closely matched to the clock-to-output delay of flip-flop 110 and its output 115, since both are effectively the delay through one flip-flop. Furthermore, the propagation delay of delay circuit 120—i.e., the time required for changes in the delay circuit input to take effect at the delay circuit output—is additionally designed to match the clock-to-output delay in both shift register 100 and flip-flop 110. Possible circuitry for matching the delays of shift register 100, flip-flop 110, and delay circuit 120 is described below in connection with FIG. 6.

Figure 3:
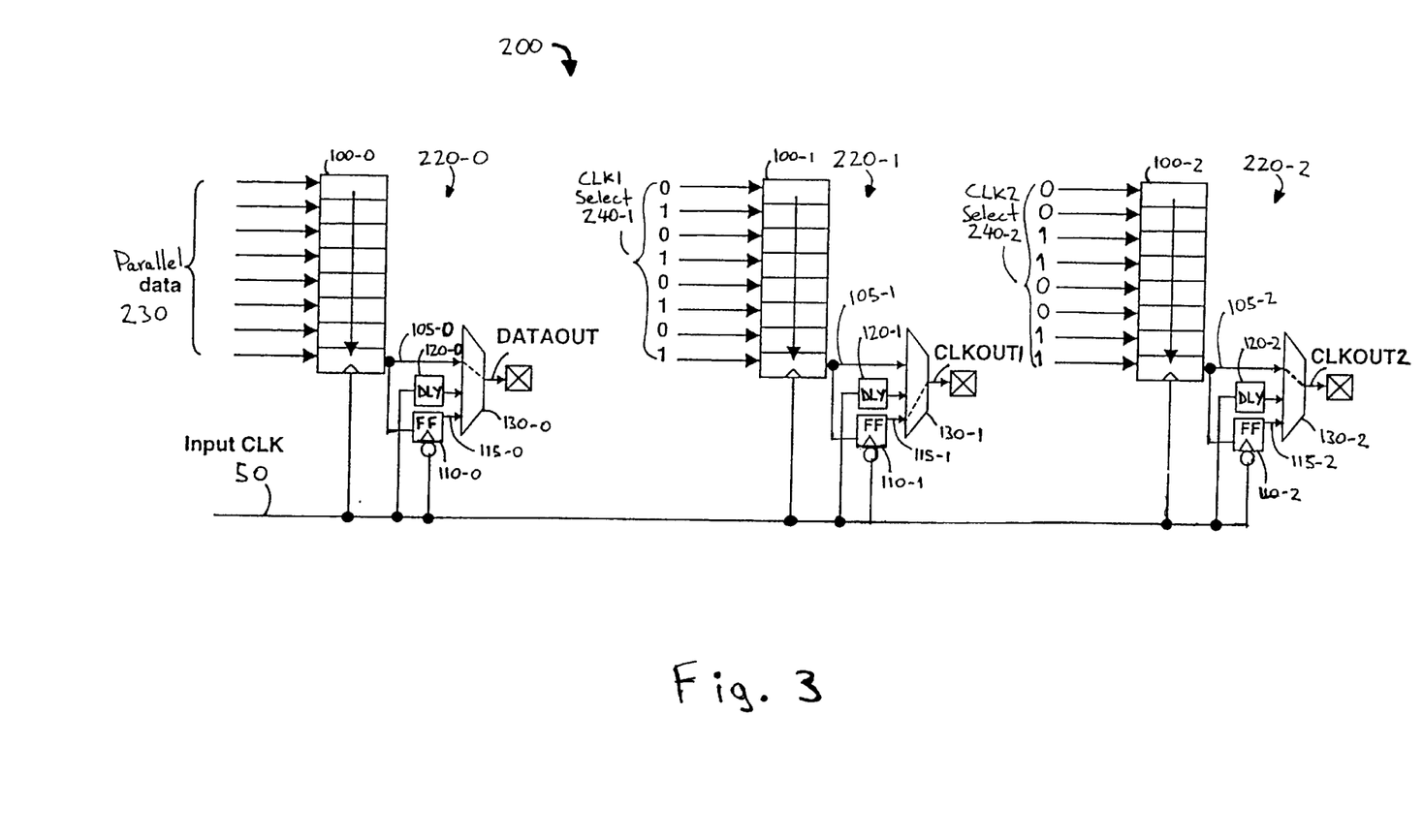
FIG. 3 shows an exemplary implementation of the circuit of FIG. 1 including one data channel circuit and two clock channel circuits.
Figure 4:
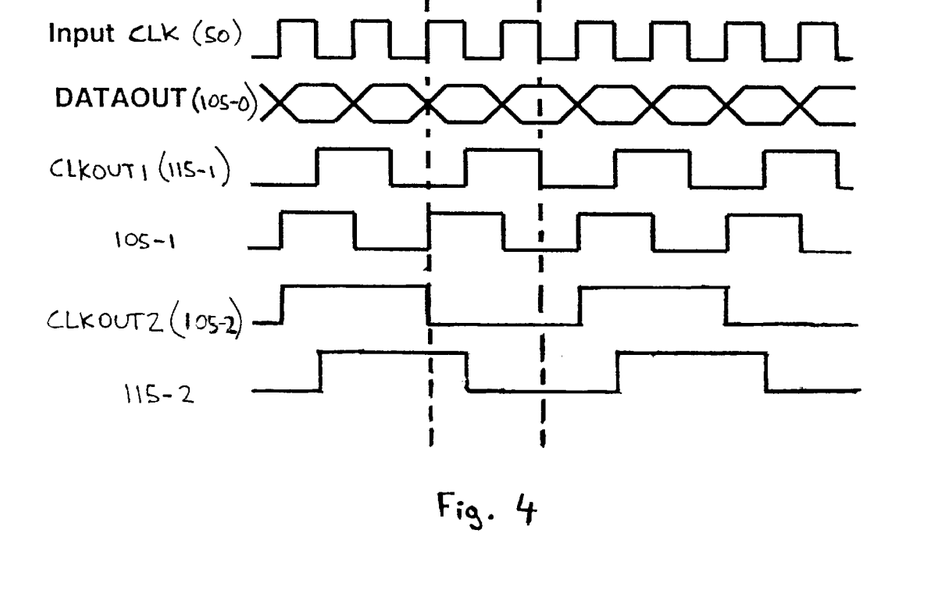
FIG. 4 is a timing diagram for several signals in the circuit of FIG. 3.

FIG. 3 illustrates an exemplary embodiment 200 of circuit 10 that includes one data channel circuit 220-0 and two clock channel circuits 220-1 and 220-2. A timing diagram for several signals in the circuit 200 is also shown in FIG. 4. Many other implementations of circuit 10 are possible including, for instance, a circuit with only two clock channels or a circuit with only one data channel and one clock channel.

Referring to FIG. 3, each of the channels 220-0, 220-1, and 220-2 may include a shift register 100, flip-flop 110, delay circuit 120, and multiplexer 130 as described above in connection with FIG. 2. In data channel 220-0, shift register 100-0 receives parallel-in data 230 and outputs a serial data signal 105-0 at its output by successively shifting out each input bit upon each rising edge in the Input CLK signal 50. As shown, the address input of multiplexer 130-0 is configured or programmed to direct signal 105-0 to the multiplexer output to provide the necessary DATAOUT signal from channel 220-0. As shown in the timing diagram of FIG. 4, the DATAOUT signal is able to change states at each rising edge of the Input CLK signal 50.

In data channel 220-1, shift register 100-1 receives the parallel-in CLK1 select bits 240-1 and outputs a serial clock signal 105-1. Again, the shift register output signal 105-1 is generated by successively and cyclically shifting out each of the bits 240-1 input to shift register 100-1 upon each rising edge in the Input CLK signal 50. As a result, where the sequence in the CLK1 select bits 240-1 is periodic, signal 105-1 becomes a periodic signal. In the embodiment of FIG. 3, where the eight CLK1 select bits, 01010101, toggle with each successive bit, the shift register output signal 105-1 has a frequency that is ½ that of the Input CLK signal 50 as shown in FIG. 4. Also, since the least significant CLK1 select bit is a 1 in FIG. 3, the edges of signal 105-1 generally coincide with the rising edges of Input CLK signal 50 (ignoring delays) as illustrated in FIG. 4. Alternatively, if the least significant bit input to shift register 100-1 is a 0 (e.g., if the CLK1 select input is 10101010), the edges of signal 105-1 coincide with the falling edges in Input CLK signal 50, and therefore the polarity of the signal 105-1 is the reverse of that shown in FIG. 4.

Within channel 220-1, the clock signal 105-1 is fed to the input of falling-edge triggered flip-flop 110-1. Thus, the level of signal 105-1 passes to the flip-flop output 115-1 upon each falling edge in the Input CLK signal 50. Consequently, signal 115-1 has the same frequency as signal 105-1, but differs in phase by ½ cycle of the Input CLK signal 50, so that signal 115-1 lags signal 105-1 by $\pi/2$ radians. In the specific embodiment illustrated in FIG. 3, multiplexer 130-1 is configured to select signal 115-1 as the CLKOUT1 signal from channel 220-1, as is indicated by the broken line within multiplexer 130-1. As shown in the timing diagram of FIG. 4, the rising (and falling) edges in the CLKOUT1 signal (signal 115-1) are aligned with the center point of each data value, i.e., the center-point between possible data transitions. As a result, the CLKOUT1 signal is considered to be "center-aligned" with the DATAOUT signal. In contrast, the rising (and falling) edges in the clock signal 105-1 are aligned with the edges or data transitions in DATAOUT, and signal 105 is therefore "edge-aligned" with DATAOUT.

Clock signal 115-1 may, for example, be suitable as the clock output for a double data rate device that requires clocking on both rising and falling edges (double-edge clocking). In other situations, signal 105-1 may be used, and multiplexer 130-1 may alternatively be configured to select signal 105-1 as the CLKOUT1 signal. Also, as will be appreciated by those skilled in the art, if shift register 100-1 is instead triggered by the falling edge of the Input CLK signal 50 and flip-flop 110-1 is instead triggered by the rising edge of signal 50, the waveforms of signals 105-1 and 115-1 in FIG. 4 will be switched, so that signal 105-1 is now center-aligned with DATAOUT and signal 115-1 is now edge-aligned with DATAOUT (assuming shift register 100-0 in channel 220-0 remains triggered by the rising edge of Input CLK signal 50).

Referring still to FIG. 3, a shift register 100-2 in the second clock channel 220-2 receives 00110011 as an 8-bit set of parallel-in CLK1 input 240-2. Thus, in channel 220-2, the clock signals 105-2 and 115-2 are ¼ the frequency of the Input CLK signal 50. As in clock channel 220-1, signal 115-2 lags signal 105-2 by ½ cycle of the Input CLK signal 50 which, in channel 220-2, represents a phase difference of $\pi/4$ radians. Either of the clock signals 105-2 or 115-2 may be delivered to a receiving device as CLKOUT2; and in the illustrated embodiment of FIG. 3, multiplexer 130-3 is configured or programmed to deliver signal 105-2 as the CLKOUT2 signal. The clock signals 105-2 and 115-2 are also shown in FIG. 4.

As indicated above, the configuration of each multiplexer 130 in circuit 10 may be an available setting in a programmable device that can be established by design software (Note that the MUXADR signals are not expressly shown in FIG. 3 for multiplexers 130-0, 130-1, and 130-2.) The CLK select bits 240 may be similarly programmed in each channel circuit for which a frequency-divided clock will be output. Furthermore, although flip-flop 110 is not used in data channel circuits 220-0 and 220-2 and although delay circuit 120 is not used in any of the channel circuits in the embodiment 200 of FIG. 3, in one embodiment, each channel circuit includes all of the circuit elements shown in FIG. 2. In known manner, by providing a number of identical, standardized channel circuits, the present invention permits a circuit designer to subsequently have much greater flexibility in terms of how each channel circuit is used—i.e., whether a channel will output a clock or a data signal and, in the case of a clock output signal, what its frequency and phase will be. However, it will also be appreciated that the channel circuits may differ and, optionally, include only the circuit elements necessary for providing the desired channel output.

FIGS. 3 and 4 illustrate how circuit 10 can be used to generate clock signals with the Input CLK signal 50 frequency divided by a factor of 2 and a factor of 4. More generally, the CLK select bits 240 input to the shift register in each clock channel circuit may be used to generate other divided-down frequency factors such as 3, 5, 6, and 8. Note that if a clock channel output CLKOUT is to have the same frequency as the Input CLK signal 50, multiplexer 130 is configured to select the output of delay circuit 120 as the channel output. Table I shows a number of CLK select bit input sequences that may be used to generate different divided-down clock output frequencies. The number M of CLK select bits in each clock channel can also vary as needed (or desired), simply by configuring the shift register to receive that number of inputs. Possible bit lengths are shown in Table I, but these are not restrictive. Thus, for example, in clock channel circuit 20-1 in FIG. 3, two (e.g., 01) or four (e.g., 0101) clock select bits could alternatively be used instead of the eight bits shown. Furthermore, as will be appreciated by those skilled in the art, the duty cycle of the clock output signals may vary depending on the frequency division factor. In particular, a 50% duty cycle is generally not realizable where frequency division is by an odd number in a channel circuit 20.

TABLE I

| CLK Select bits | M (bit length) | Frequency Division Factor | Duty Cycle |
| --- | --- | --- | --- |
| 01010101 | 8 | 2 | 50% |
| 011011 | 6 | 3 | 66⅔% |
| 001001 | 6 | 3 | 33⅓% |
| 00110011 | 8 | 4 | 50% |
| 01110111 | 8 | 4 | 75% |
| 00010001 | 8 | 4 | 25% |
| 0011100111 | 10 | 5 | 60% |
| 0001100011 | 10 | 5 | 40% |
| 000111 | 6 | 6 | 50% |
| 00001111 | 8 | 8 | 50% |

Figure 5:
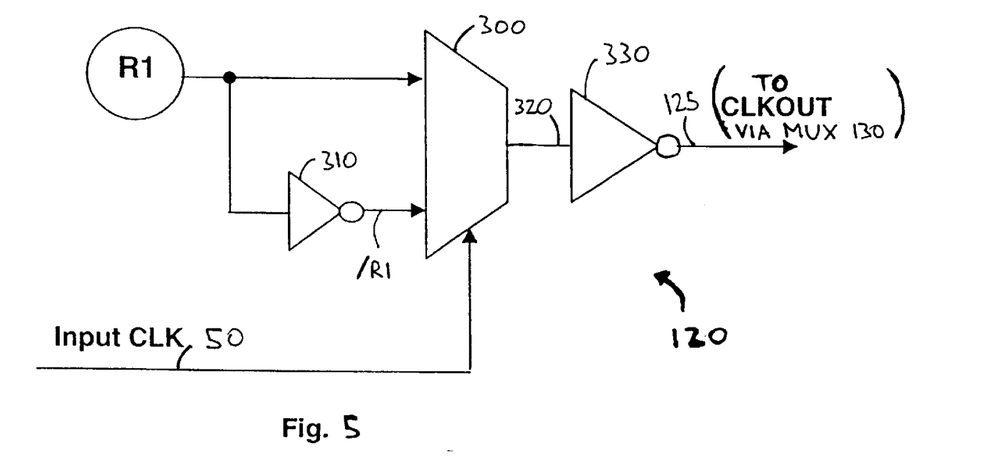
FIG. 5 is circuit diagram of an embodiment of the delay circuit in the channel circuit of FIG. 2.

As already indicated, where it is desired for a clock channel output CLKOUT to have the same frequency as the Input CLK signal 50, multiplexer 130 is configured to select the delay circuit output signal 125 as the channel output. Although in the illustrated embodiment, all channel circuits 20 include a shift register 100 and flip-flop 110 as circuit elements to increase programmable design flexibility, in same frequency clock channels those circuit elements generally remain unused, and instead the CLKOUT signal is generated by delay circuit 120. FIG. 5 is a circuit diagram of a possible embodiment of delay circuit 120 in channel circuit 20.

Referring to FIG. 5, delay circuit 120 includes a two-input multiplexer 300 that uses the Input CLK signal 50 to provide the 1-bit address for input selection. The signal inputs to multiplexer 300 are a bit signal R1 and its complement/R1, as generated by an inverter 310. The value of R1, 1 or 0, may be a programmable setting, within each channel of circuit 10, that can be set in a user design step. By selecting either R1=1 or R1=0, the output 320 of multiplexer 300 has either the same polarity as or the opposite polarity to the Input CLK signal 50. It will be appreciated that, since the propagation delay in multiplexer circuit 130 is small in comparison to the period of the Input CLK signal 50 a "same" polarity in this context means that the output 320 is substantially in phase with Input CLK signal 50 and an "opposite" polarity in this context means that the output 320 is substantially π radians out of phase with the Input CLK signal. Also, it should be noted that whether the same polarity setting corresponds to R1=0 or to R1=1 will depend on the configuration of multiplexer 300 in terms of which of R1 and /R1 is passed to the multiplexer output 320, followed by an inverter 330, when Input CLK signal 50 is high. Consequently, the setting of R1 conveniently determines the polarity of the clock signal 125 output by delay circuit 120.

Figure 6:
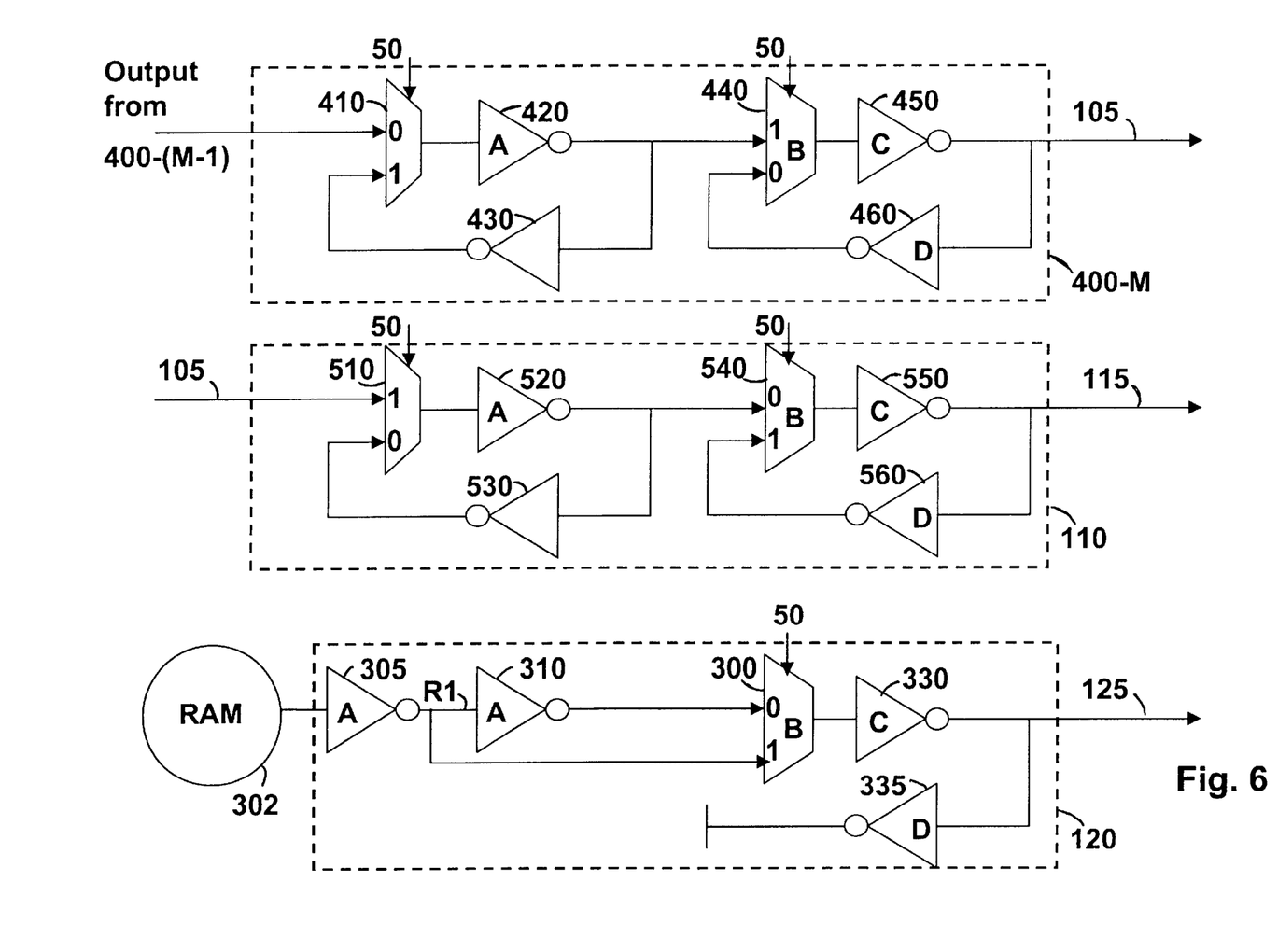
FIG. 6 illustrates circuitry in one embodiment for matching the clock-to-output delay in the shift register circuit, flip-flop circuit, and delay circuit of the channel circuit in FIG. 2.

FIG. 6 illustrates circuitry in one embodiment for ensuring that the clock-to-output delays in each of circuits 100, 110, and 120 are matched. FIG. 6 shows the delay circuit 120, flip-flop circuit 110, and the Mth register 400-M in shift register circuit 100. The other registers in shift register 100 may be similarly constructed, and the input to register 400-M is the output of the previous register 400-(M−1). Register 400-M shifts out the least significant bit to provide the shift register output 105. As noted above, each register circuit 400 is generally a flip-flop circuit, and therefore register circuit 400-M and flip-flop circuit 110 are identically constructed. More particularly, the register and flip-flop circuits in FIG. 6 are constructed from two pairs of cross-coupled inverters as is well known. Specifically, as shown, the input to register 400-M is provided to the 0 address input of a multiplexer 410 having the Input CLK signal 50 as the address selection input. The output of multiplexer 410 is provided to an inverter 420, the output of which is provided to the input of a cross coupled inverter 430 and to the 1 address input of a second multiplexer 440. The output of inverter 430 is fed back to the 1 address of multiplexer 410. Similarly, the output of multiplexer 440 is provided to an inverter 450 which then provides the shift register output 105. The output of inverter 450 is also provided to the input of a cross coupled inverter 460, and the output of inverter 460 is provided to the 0 input of multiplexer 440. Thus upon the falling edge of the Input CLK signal 50, and more generally the output from the previous register 400-(M−1) is clocked via multiplexer 410 and inverter 420 to multiplexer 440. Upon the rising edge of clock 50, multiplexer 440 passes that signal via inverter 450 to output 105. In known manner, when the Input CLK signal 50 is high, cross coupled inverters 420 and 430 keep the input at multiplexer 440 latched to its current level, and similarly cross coupled inverters 450 and 460 keep the shift register output 105 latched to its current level when signal 50 is low. Register 400-M thus clocks out the data or CLK select bits upon each rising edge in the Input CLK signal 50.

As shown in FIG. 6, flip-flop circuit 110 includes two multiplexers 510 and 540 and fours inverters 520, 530, 550, and 560. The operation of flip-flop circuit 110 is the same as that for register 400-M described above, except that the flip flop input (shift register output 105) is clocked out as signal 115 upon the falling edge of the Input CLK signal 50. Delay circuit 120 includes a multiplexer 300, and inverters 310 and 330 substantially as shown in FIG. 5, but also includes another inverter 305 which provides the R1 signal from a programmable RAM 302. Inverter 335 acts as a load of inverter 330 and affects the switching speed of inverter 330.

As shown by the letter designations in FIG. 6, inverters 420, 520, 305, and 310 are matched, multiplexers 440, 540, and 300 are matched, inverters 450, 550, and 330 are matched, and inverters 460, 560 and 335 are matched. As a result, the clock-to-output delay in register 400-M, flip-flop circuit 110, and delay circuit 120 is generally the same for various process, temperature, and supply voltage conditions. The effect of inverters 430 and 530 on the clock-to-output delay is small compared to inverters 420, 520, 310, and 305, and therefore it is not critical that inverters 430 and 530 be exactly matched to the other "A"-sized inverters 420, 520, 310, and 305. Of course, all of the inverters used should be fast enough to accommodate the required frequency. It will be appreciated that the circuit architecture illustrated in FIG. 6 is only one possible implementation for achieving delay-matching, and numerous other configurations may alternatively be used.

While the invention has been described in conjunction with specific embodiments, it is evident that numerous alternatives, modifications, and variations will be apparent to those skilled in the art in light of the foregoing description.

What is claimed is:

1. A circuit comprising a plurality of channel circuits, each channel circuit including:
    a shift register circuit for receiving a plurality of input bit signals in parallel and shifting out a serial register output signal in response, the shift register circuit being triggered by an input clock signal;
    a flip-flop circuit for receiving the register output signal at an input thereof and providing a flip-flop output signal in response, the flip-flop circuit being triggered by the input clock signal; and
    a multiplexer circuit for receiving the register output signal and the flip-flop output signal at first and second inputs thereof, the multiplexer circuit being configurable to output the signal at one of the multiplexer inputs as a channel output signal.

2. The circuit of claim 1 wherein an input clock-to-output delay of the shift register is substantially the same as an input clock-to-output delay of the flip-flop circuit.

3. The circuit of claim 1 wherein at least one channel circuit is a frequency-divided clock channel circuit in which the plurality of parallel input bit signals received by the shift register are fixed digital signals such that the register output signal and the flip-flop output signal in said channel are each clock signals having a frequency that is divided down by a factor of at least two with respect to the input clock signal.

4. The circuit of claim 3 wherein, in each of the at least one frequency-divided clock channel circuits, the shift register is triggered by a first edge in the input clock signal and the flip-flop circuit is triggered by a second edge in the input clock signal, such that the register output clock signal and the flip-flop output clock signal have a phase difference equivalent in time to one half cycle of the input clock signal.

5. The circuit of claim 4 wherein, in each of the at least one frequency-divided clock channel circuits, the first edge in the input clock signal is a rising edge and the second edge in the input clock signal is a falling edge.

6. The circuit of claim 3 wherein, in one frequency-divided clock channel circuit, the parallel input bit signals comprise an even number sequence of alternating digital ones and zeros such that the frequency of the serial register output signal and of the flip-flop output signal is one half that of the input clock signal.

7. The circuit of claim 3 wherein, in each of the at least one frequency-divided clock channel circuits, the parallel input bit signals are programmable settings.

8. The circuit of claim 3 wherein at least one channel circuit is a data channel circuit in which the plurality of parallel input bit signals received by the shift register are data signals such that the register output signal is a serial data signal, the multiplexer circuit in each of the at least one data channel circuits being configured to output the serial data signal as the channel output signal.

9. The circuit of claim 1 wherein the flip-flop circuit in each channel circuit is a delay type flip-flop circuit.

10. The circuit of claim 1 wherein the shift register circuits in the channel circuits all receive the same number of parallel input bit signals.

11. The circuit of claim 1 wherein, in each channel circuit, the multiplexer circuit includes a programmable setting for configuring the multiplexer circuit to output the signal at a desired one of the multiplexer inputs as the channel output signal.

12. A circuit comprising a plurality of channel circuits, each channel circuit comprising:
    a shift register circuit for receiving a plurality of input bit signals in parallel and shifting out a serial register output signal in response, the shift register circuit being triggered by an input clock signal;
    a flip-flop circuit for receiving the register output signal at an input thereof and providing a flip-flop output signal in response, the flip-flop circuit being triggered by the input clock signal;
    a delay circuit for receiving the input clock signal and outputting a delayed version of the input clock signal; and
    a multiplexer circuit for receiving the register output signal, the flip-flop output signal and the delayed version of the input clock signal at first, second and third inputs thereof, the multiplexer circuit being configurable to output the signal at one of the first, second and third multiplexer inputs as a channel output signal.

13. The circuit of claim 12 wherein an input clock-to-output delay of the shift register is substantially the same as an input clock-to-output delay of the flip-flop circuit and as a propagation delay of the input clock in the delay circuit.

14. The circuit of claim 12 wherein at least one channel circuit is a frequency-divided clock channel circuit in which the plurality of parallel input bit signals received by the shift register are fixed digital signals such that the serial register output signal and the flip-flop output signal in said channel are each clock signals having a frequency that is divided down by a factor of at least two with respect to the input clock signal.

15. The circuit of claim 14 wherein, in each of the at least one frequency-divided clock channel circuits, the shift register is triggered by a first edge in the input clock signal and the flip-flop circuit is triggered by a second edge in the input clock signal, such that the register output clock signal and the flip-flop output clock signal have a phase difference equivalent in time to one half cycle of the input clock signal.

16. The circuit of claim 12 wherein at least one channel circuit is a data channel circuit in which the plurality of parallel input bit signals received by the shift register are data signals such that the serial register output signal is a serial data signal, the multiplexer circuit in each of the at least one data channel circuits being configured to output the serial data signal as the channel output signal.

17. The circuit of claim 12 wherein at least one channel circuit is a same-frequency clock channel circuit, the multiplexer circuit in each of the at least one same-frequency clock channel circuits being configured to output the delayed version of the input clock signal as the channel output signal.

18. The circuit of claim 12 wherein at least one channel circuit is programmably configurable to provide one of:
    a frequency-divided clock channel circuit in which the plurality of parallel input bit signals received by the shift register are fixed digital signals such that the serial register output signal and the flip-flop output signal in said channel circuit are each clock signals having a frequency that is divided down by a factor of at least two with respect to the input clock signal; and a same-frequency clock channel circuit, in which the multiplexer circuit in said channel circuit is configured to output the delayed version of the input clock signal as the channel output signal.

19. The circuit of claim 12 wherein, in each channel circuit, the delay circuit includes a programmable polarity selection input, wherein when the polarity selection input is in a first state the delayed version of the input clock signal has substantially the same polarity as the input clock signal and when the polarity selection input is in a second state the delayed version of the input clock signal has a substantially opposite polarity to the input clock signal.

20. The circuit of claim 19 wherein, in each channel circuit, the delay circuit comprises a delay multiplexer circuit having a first input for receiving the polarity selection input, a second input for receiving a complement of the polarity selection input, and a selection input for receiving the input clock signal.

21. The circuit of claim 12 wherein, in each channel circuit, the multiplexer circuit includes a programmable setting for configuring the multiplexer circuit to output the signal at a desired one of the multiplexer inputs as the channel output signal.

22. A circuit for providing a clock signal comprising:

a shift register circuit for receiving a plurality of fixed clock frequency select bit signals in parallel and shifting out a register output clock signal in response, the shift register circuit being triggered by an input clock signal such that the register output clock signal has a frequency that is divided down by a factor of at least two with respect to the input clock signal;

a flip-flop circuit for receiving the register output clock signal at an input thereof and providing a flip-flop output clock signal in response, the flip-flop circuit being triggered by the input clock signal and the flip-flop output clock signal having the same frequency as the register output clock signal; and a multiplexer circuit for receiving the register output clock signal and the flip-flop output clock signal at first and second multiplexer inputs thereof, the multiplexer circuit being configurable to output the signal at one of the multiplexer inputs as a clock output signal.

23. The circuit of claim 22 wherein the shift register is triggered by a first edge in the input clock signal and the flip-flop circuit is triggered by a second edge in the input clock signal, such that the register output clock signal and the flip-flop output clock signal have a phase difference equivalent in time to one half cycle of the input clock signal.

24. The circuit of claim 22 further comprising a circuit for providing a data signal including:

a second shift register circuit for receiving a plurality of data bit signals in parallel and shifting out a serial data signal in response, the second shift register circuit being triggered by the input clock signal, and a second multiplexer circuit for receiving the serial data signal at an input thereof and being configured to output the serial data signal.

25. The circuit of claim 24 wherein an input clock-to-output delay of the second shift register is substantially the same as an input clock-to-output delay of the first shift register and as an input clock-to-output delay of the flip-flop circuit.

26. The circuit of claim 22 wherein the clock frequency select bit signals are programmable settings.

27. The circuit of claim 22 wherein the multiplexer circuit includes a programmable setting for configuring the multiplexer circuit to output the signal at a desired one of the multiplexer inputs as the clock output signal.

28. The circuit of claim 22 further comprising a delay circuit for receiving the input clock signal and outputting a delayed version of the input clock signal, and wherein the multiplexer circuit has a third input for receiving the delayed version of the input clock signal.

29. The circuit of claim 28 wherein an input clock-to-output delay of the shift register circuit is substantially the same as an input clock-to-output delay of the flip-flop circuit and as a propagation delay of the input clock in the delay circuit.

30. The circuit of claim 29 wherein the delay circuit includes a programmable polarity selection input, wherein when the polarity selection input is in a first state the delayed version of the input clock signal has substantially the same polarity as the input clock signal and when the polarity selection input is in a second state the delayed version of the input clock signal has a substantially opposite polarity to the input clock signal.

31. The circuit of claim 30 wherein the delay circuit comprises a delay multiplexer circuit having a first input for receiving the polarity selection input, a second input for receiving a complement of the polarity selection input, and a selection input for receiving the input clock signal.

* * * * *